US009143336B2

(12) United States Patent
Jain et al.

(10) Patent No.: US 9,143,336 B2
(45) Date of Patent: Sep. 22, 2015

(54) EFFICIENT LAYER-2 MULTICAST TOPOLOGY CONSTRUCTION

(71) Applicant: BROCADE COMMUNICATIONS SYSTEMS, INC., San Jose, CA (US)

(72) Inventors: Nitin Jain, Saratoga, CA (US); Aseem S. Rastogi, Fremont, CA (US)

(73) Assignee: BROCADE COMMUNICATIONS SYSTEMS, INC., San Jose, CA (US)

( * ) Notice: Subject to any disclaimer, the term of this patent is extended or adjusted under 35 U.S.C. 154(b) by 160 days.

(21) Appl. No.: 13/928,019

(22) Filed: Jun. 26, 2013

(65) Prior Publication Data

US 2014/0003285 A1 Jan. 2, 2014

Related U.S. Application Data

(60) Provisional application No. 61/666,620, filed on Jun. 29, 2012.

(51) Int. Cl.

| | |
|---|---|
| ***H04L 12/28*** | (2006.01) |
| ***H04L 12/18*** | (2006.01) |
| ***H04L 12/751*** | (2013.01) |
| ***H04L 12/721*** | (2013.01) |
| ***H01L 45/00*** | (2006.01) |

(52) U.S. Cl.

CPC ............ *H04L 12/1863* (2013.01); *H01L 45/16* (2013.01); *H04L 45/02* (2013.01); *H04L 45/66* (2013.01)

(58) Field of Classification Search

None

See application file for complete search history.

(56) References Cited

U.S. PATENT DOCUMENTS

| | | | | |
|---|---|---|---|---|
| 5,793,975 | A * | 8/1998 | Zeldin | 709/224 |
| 2009/0245255 | A1* | 10/2009 | Cao et al. | 370/390 |
| 2010/0251037 | A1* | 9/2010 | Cao et al. | 714/57 |
| 2011/0235638 | A1* | 9/2011 | Tempia Bonda | 370/390 |
| 2012/0063453 | A1 | 3/2012 | Keesara et al. | |

FOREIGN PATENT DOCUMENTS

| | | | |
|---|---|---|---|
| EP | 1865624 | A1 | 12/2007 |
| EP | 2079198 | A1 | 7/2009 |
| EP | 2541852 | A1 | 1/2013 |

OTHER PUBLICATIONS

Asaeda, H. et al., "Mtrace Version 2: Traceroute Facility for IP Multicast draft-ietf-mboned-mtrace-v2-08", 2011.

Cain, B. et al., "Internet Group Management Protocol, Version 3", XP015009135, Oct. 2002.

* cited by examiner

*Primary Examiner* — Chi H Pham

*Assistant Examiner* — Fahmida Chowdhury

(74) *Attorney, Agent, or Firm* — Shun Yao; Park, Vaughan, Fleming & Dowler LLP

(57) ABSTRACT

One embodiment of the present invention provides a switch. The switch includes a processor and a computer-readable storage medium. The computer-readable storage medium stores instructions which when executed by the processor cause the processor to perform a method. The method comprises determining whether the switch is a leaf switch of a multicast distribution tree of a multicast group based on a multicast topology query message from a root switch of the multicast distribution tree. If the switch is a leaf switch, the method further comprises constructing a multicast topology report message comprising layer-2 topology information of the multicast group associated with the switch.

19 Claims, 11 Drawing Sheets

EFFICIENT LAYER-2 MULTICAST TOPOLOGY CONSTRUCTION

RELATED APPLICATION

This application claims the benefit of U.S. Provisional Application No. 61/666,620, titled "Multicast Topology Construction within L2 VLAN," by inventors Nitin Jain and Aseem Rastogi, filed 29 Jun. 2012, the disclosure of which is incorporated by reference herein.

BACKGROUND

1. Field

The present disclosure relates to network management. More specifically, the present disclosure relates to a method and system for efficient layer-2 multicast topology construction.

2. Related Art

The exponential growth of the Internet has made it a popular delivery medium for multimedia applications, such as video on demand and television. Such applications have brought with them an increasing demand for bandwidth. As a result, equipment vendors race to build larger and faster switches with versatile capabilities, such as multicasting, to move more traffic efficiently. However, the size of a switch cannot grow infinitely. It is limited by physical space, power consumption, and design complexity, to name a few factors. Furthermore, switches with higher capability are usually more complex and expensive. More importantly, because an overly large and complex system often does not provide economy of scale, simply increasing the size and capability of a switch may prove economically unviable due to the increased per-port cost.

One way to meet this challenge is to interconnect a number of switches to support a large number of multicast users. Interconnecting such a large number of switches in a layer-3 network requires tedious and complex configurations on a respective switch, typically performed by a network administrator. Such configuration includes assigning an address for a respective interface and configuring routing protocols for the switch. These issues can be solved by interconnecting switches via layer-2. As layer-2 (e.g., Ethernet) switching technologies continue to evolve, more flexible functionalities, such as a distributed virtualized layer-2 network across layer-3 (e.g., Internet Protocol or IP) networks, are being supported.

An efficient multicast topology is usually desirable in a network. A network administrator uses a multicast topology to manage the distribution of data traffic belonging to a corresponding multicast group in the network. A multicast topology in a layer-2 virtual local area network (VLAN) can span multiple physical layer-3 networks. A VLAN typically carries data traffic belonging to multiple multicast groups. A respective multicast group can have a different instance of a multicast topology within the same VLAN. In a VLAN, for a specific multicast group, a multicast topology represents an active data path between a respective layer-2 switch in the VLAN and the root switch/router, which is coupled to a source, associated with the corresponding multicast group. With existing technologies, obtaining such a data path is only supported in layer-3 and requires device-specific information (e.g., an IP address) of at least one router (usually the terminating router or leaf router) in the path. Furthermore, even in layer-3, only one such data path for one multicast group can be obtained at a time. Consequently, constructing a multicast topology for a multicast group can be tedious and repetitious.

While multicast brings many desirable features to a network, some issues remain unsolved in efficient multicast topology construction in a layer-2 network.

SUMMARY

One embodiment of the present invention provides a switch. The switch includes a processor and a computer-readable storage medium. The computer-readable storage medium stores instructions which when executed by the processor cause the processor to perform a method. The method comprises determining whether the switch is a leaf switch of a multicast distribution tree of a multicast group based on a multicast topology query message from a root switch of the multicast distribution tree. If the switch is the a switch, the method further comprises constructing a multicast topology report message comprising layer-2 topology information of the multicast group associated with the switch.

In a variation on this embodiment, if the switch is a leaf switch, the method further comprises including additional information in the multicast topology report message. This additional information corresponds to device and link information associated with the switch.

In a variation on this embodiment, the destination address of the report message corresponds to a multicast address of the multicast group.

In a variation on this embodiment, the method further comprises enabling an alert option for the multicast topology report message. The alert option allows a second switch to process contents of the multicast topology report message.

In a variation on this embodiment, if the switch is not a leaf switch, the method comprises extracting layer-2 topology information of the multicast group from a first multicast topology report message.

In a further variation, the method further comprises including layer-2 topology information of the multicast group associated with the switch in the first multicast topology report message.

In a further variation, the method further comprises extracting layer-2 topology information of the multicast group from a second multicast topology report message. The extracted layer-2 topology information from the first and second multicast topology report messages corresponds to a plurality of downstream switches in the multicast distribution tree with respect to the switch.

In a further variation, the method further comprises summarizing the extracted layer-2 topology information corresponding to the plurality of downstream switches and including the summarized information in a third multicast topology report message. The method also comprises including layer-2 topology information of the multicast group associated with the switch in the third multicast topology report message.

In a further variation, the method further comprises precluding the switch from associating a local port with the third multicast topology report message as an output port. The local port corresponds to a downstream switch of the multicast distribution tree.

DETAILED DESCRIPTION

Figure 1A:
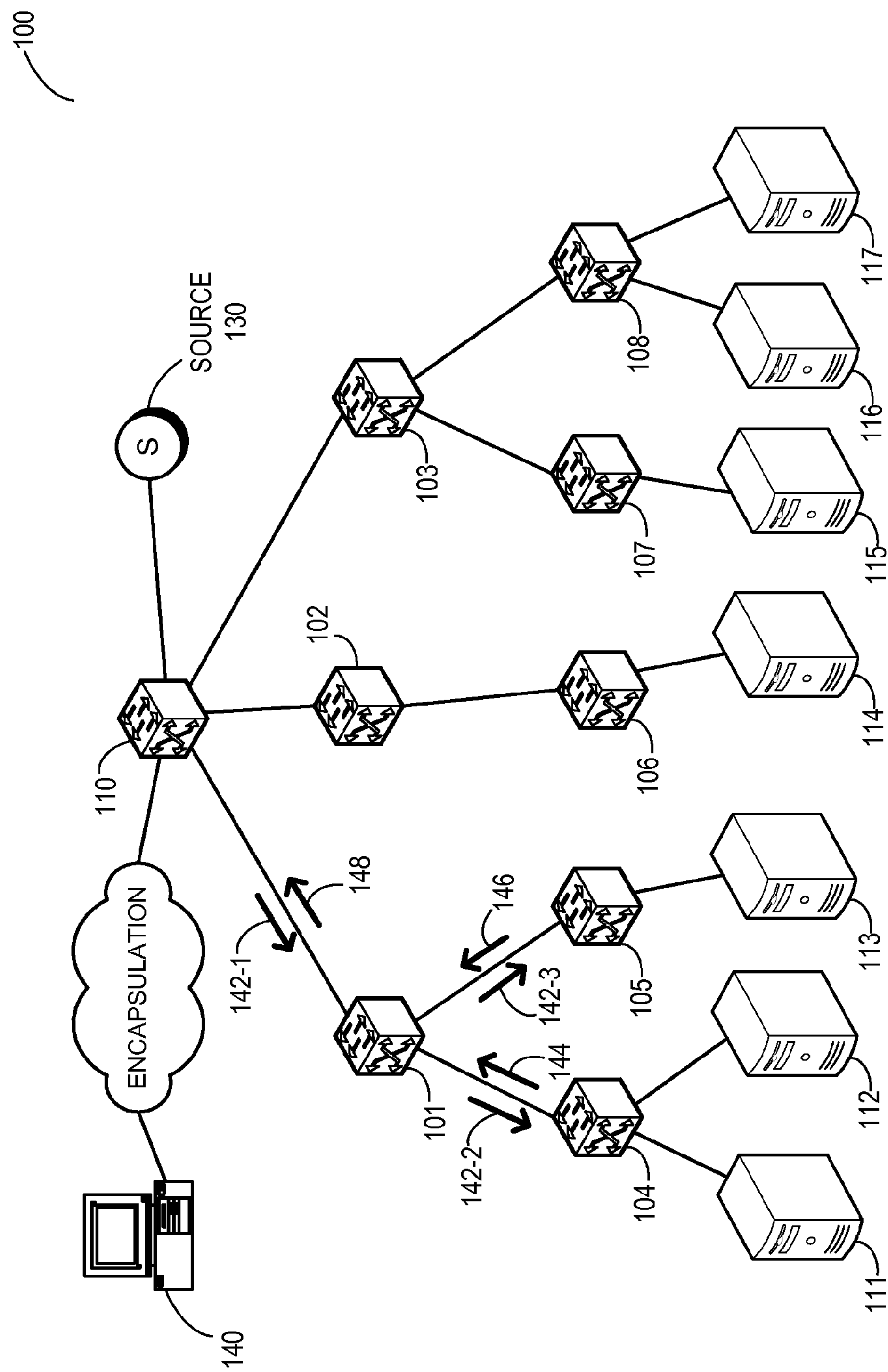
FIG. 1A illustrates an exemplary layer-2 multicast topology construction, in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

In embodiments of the present invention, the problem of efficiently constructing a multicast topology in a layer-2 network is solved by a respective switch in the layer-2 network disseminating multicast topology information to a root switch of a multicast group. A root switch is typically the switch to which a source for the multicast group is coupled. In the layer-2 network, for a specific multicast group, the multicast topology represents an active (i.e., not via any blocked port) data path between a respective layer-2 switch in the network and the root switch of the multicast group. A layer-2 network can be a physical local area network (LAN) or a virtual LAN (VLAN).

With existing technologies, obtaining a respective data path in a multicast topology requires switch-specific information of the root switch and at least one other switch (usually the terminating switch or leaf switch) in the path. By sending a query to the leaf switch, only that specific data path to the leaf switch can be obtained. Consequently, constructing a multicast topology, which includes data paths to all leaf switches, for a multicast group requires repeated construction of data path for a respective leaf switch of the multicast group. If switch-specific information of a leaf switch is not known, the constructed topology may not represent the data path toward that leaf switch and the multicast topology can have an inaccurate representation. Moreover, because this process is specific to the data path construction, the process does not collect additional information to validate the multicast states in the paths. As a result, constructing a multicast topology in a layer-2 network can be tedious, repetitious, error-prone, and often incomplete.

To solve this problem, the root switch of the multicast group constructs a multicast topology in the layer-2 network by sending a multicast topology query message to a respective switch via its multicast distribution tree of the multicast group. Because the root switch uses the multicast distribution tree, switch-specific information for a respective leaf switch is not needed. A respective switch coupled to the root switch receives this query message from the root switch and forwards the query message further downstream until a leaf switch is reached. The leaf switch constructs a multicast topology report message, which comprises multicast topology information associated with the switch, and forwards the report message to the upstream switch (i.e., the switch from which it has received the query message). The upstream switch processes the message, adds its own multicast information to the message, and forwards the message further upstream. In this way, the report message is processed, hop-by-hop, from a respective leaf switch in the multicast distribution tree to the root switch. As a result, a single query can obtain the multicast topology of a respective multicast group. Because the query and report messages traverse the multicast distribution tree, the multicast topology represents the multicast distribution tree accurately. Furthermore, if needed, the report message can include additional information, such as multicast state validation information, link information, multicast resource information (e.g., hardware and/or software forwarding indices), etc.

In some embodiments, a switch in a layer-2 network can be a fabric switch. A fabric switch in the network can be an Ethernet fabric switch or a virtual cluster switch (VCS). In an Ethernet fabric switch, any number of switches coupled in an arbitrary topology may logically operate as a single switch. Any new switch may join or leave the fabric switch in "plug-and-play" mode without any manual configuration. In some embodiments, a respective switch in the Ethernet fabric switch is a Transparent Interconnection of Lots of Links (TRILL) routing bridge (RBridge). A fabric switch appears as a single logical switch to all other devices in the network.

Although the present disclosure is presented using examples based on the layer-2 protocols, embodiments of the present invention are not limited to layer-2 networks. Embodiments of the present invention are relevant to any networking protocol which requires loop-free communication between two networking devices. In this disclosure, the term "layer-2 network" is used in a generic sense, and can refer to any networking layer, sub-layer, or a combination of networking layers.

In this disclosure, the term "end device" can refer to a host machine, a conventional layer-2 switch, or any other type of network device. Additionally, an end device can be coupled to other switches or hosts further away from a layer-2 network. An end device can also be an aggregation point for a number of network devices to enter the layer-2 network.

The term "message" refers to a group of bits that can be transported together across a network. "Message" should not be interpreted as limiting embodiments of the present invention to a particular network layer. "Message" can be replaced by other terminologies referring to a group of bits, such as "packet," "frame," "cell," or "datagram."

The term "switch" is used in a generic sense, and can refer to any standalone or fabric switch operating in any network layer. "Switch" should not be interpreted as limiting embodiments of the present invention to layer-2 networks. Any physical or virtual device that can forward traffic in a network can be referred to as a "switch." Examples of a "switch" include, but are not limited to, a layer-2 switch, a layer-3 router, a TRILL RBridge, or a virtual machine with frame forwarding capability.

The term "multicast topology" is used in a generic sense, and can refer to any topology associated with any "multicast protocol." A "multicast topology" represents a respective data path to a respective leaf networking device in a multicast distribution tree of the multicast group. A "multicast protocol" can refer to any protocol that can be used by devices in a network to distribute multicast data and/or control information. Examples of multicast protocol include, but are not limited to, Internet Group Management Protocol (IGMP), Multicast Listener Discovery (MLD) protocol, and Protocol-Independent Multicast (PIM). The term "multicast distribution tree" is also used in a generic sense, and can refer to any tree topology that can be used to distribute multicast data and/or control information in a network.

Network Architecture

FIG. 1A illustrates an exemplary layer-2 multicast topology construction, in accordance with an embodiment of the present invention. As illustrated in FIG. 1, a layer-2 network 100 includes switches 101, 102, 103, 104, 105, 106, 107, and 108. Network 100 can be a physical local area network (LAN) or a virtual LAN (VLAN). In some embodiments, one or more switches in network 100 can be in a fabric switch and can appear as a single logical switch to all other switches in network 100. A number of end devices 111, 112, 113, 114, 115, 116, and 117 are coupled to switches 104, 105, 106, 107, and 108. Switch 110 is coupled to switches 101, 102, and 103. A source 130, which can be an end device, for a multicast group is coupled to switch 110.

During operation, switch 110 distributes periodic membership queries for the multicast group through network 100. In some embodiments, switch 110 is a layer-3 router and generates the membership queries. One or more of the end devices 111-117 can join the multicast group by sending a join request in response to the membership query. In some embodiments, IGMP and/or MLD can be used for the membership queries and corresponding join requests. In this way, the end devices become receivers of multicast data traffic from source 130. By forwarding multicast membership queries and join messages, a respective switch in network 100 is aware of the membership in the multicast group and forms an association with the multicast group.

Switch 110 directs data traffic from source 130 toward the receivers via the switches in network 100, thereby forming a multicast distribution tree rooted at switch 110 for the multicast group. Switch 110 operates as the root switch for the multicast distribution tree because switch 110 is coupled to source 130 and first receives multicast data traffic from source 130 in network 100. In the multicast distribution tree, switches 104, 105, 106, 107, and 108 are referred to as leaf switches because these switches do not have any other downstream switches coupled to them.

Suppose that end devices 111, 112, and 113 have joined the multicast group and have become receivers of data traffic from source 130. Hence, the corresponding multicast topology represents a forwarding data path from switch 110 to switch 104, which is coupled to end devices 111 and 112, and to switch 105, which is coupled to end device 113. With existing technologies, obtaining such a data path is only supported in layer-3, where it requires switch-specific information, such as a switch identifier (e.g., an IP address) for root switch 110, and leaf switches 104 and 105. To obtain the path to switch 104 in network 100, an end device 140, which can be an administrator device, sends an instruction to root switch 110 based on the switch identifiers of switch 110 and switch 104. In some embodiments, end device 140 resides in a different subnet than network 100 and can use encapsulation (e.g., a tunnel encapsulation) to communicate with switch 110. Based on the received instruction, switch 110 instructs switch 104 to inform switch 110 regarding the path.

Consequently, switch 104 sends a message to switch 110, which obtains the path information from switch 110 to switch 104 by traversing the path, hop-by-hop, in reverse direction. Upon receiving the message, switch 110 sends the path information back to end device 140. In the same way, end device 140 can obtain the path information from switch 110 to switch 105 by issuing another instruction based on the switch identifiers of switch 110 and switch 105. As a result, constructing the multicast topology requires repeated construction of data paths from switch 110 to switches 104 and 105. Furthermore, if end device 140 is not aware of one of the switches, such as switch 105, the constructed multicast topology does not include the path to switch 105 and becomes incomplete.

To solve this problem, when root switch 110 receives an instruction for constructing a layer-2 multicast topology, switch 110 sends a multicast topology query message 142-1 to a respective switch via its multicast distribution tree of the multicast group. In some embodiments, a network administrator provides the instruction to switch 110. The network administrator can also provide the instruction to end device 140, which, in turn, sends a notification message comprising the instruction to switch 110. This notification message can be encapsulated in a tunnel encapsulation. In this example, switch 110 is coupled to switch 101 in the multicast distribution tree and sends query message 142-1 to switch 101. In some embodiments, switch 110 simply sends query message 142-1 to all switches coupled to switch 110 (i.e., switches 101, 102, and 103). Upon receiving query message 142-1, a respective switch can either forward query message 142-1 via all other switches, or can selectively forward query message 142-1 to the downstream switches associated with the multicast group in layer-2 network 100. Such selective forwarding can be referred to as pruning.

Upon receiving query message 142-1, switch 101 identifies the local ports of switch 101, which are coupled to downstream switches 104 and 105 in the multicast distribution tree. Based on the identification, switch 101 forwards query messages 142-2 and 142-3 to switches 104 and 105, respectively. Note that query messages 142-1, 142-2, and 142-3 are copies of the same query message and can generally be referred to as query message 142. Upon receiving query message 142-2, switch 104 detects that switch 104 is coupled to no other downstream switch in the multicast distribution tree and, hence, identifies itself as a leaf switch. In some embodiments, when switch 104 becomes active (e.g., is turned on), switch 104 determines whether switch 104 is a leaf switch or not for the multicast group, and detects switch 101 as the upstream switch. Upon receiving query message 142-2, switch 104 then detects the corresponding multicast group and promotes the packet to processing. In some embodiments, switch 104 can be configured as a leaf switch (e.g., by a network administrator). Switch 104 then constructs a multicast topology report message 144 and includes multicast topology information in report message 144. Examples of multicast topology information include, but are not limited to, one or more identifiers of switch 104 (e.g., a layer-2 media access control (MAC) address and/or a layer-3 IP address), an indicator of membership in a multicast group, a port identifier which identifies the upstream port coupled to upstream switch 101, a list of downstream ports associated with the multicast group (e.g., ports coupling end devices 111 and 112), and information regarding any layer-3 router coupled to switch 104. In addition, switch 104 can include additional information, such as multicast validation information, link capacity and/or utilization of the links between switches 101 and 104, VLAN information, encapsulation (e.g., tunneling) information, and multicast resource information (e.g., hardware and/or software forwarding indices in switch 104).

Similarly, upon receiving query message 142-3, switch 105 identifies itself as a leaf switch and constructs a multicast topology report message 146 and includes multicast topology information in report message 146. Switches 104 and 105 send report messages 144 and 146, respectively, to the multicast address of the multicast group. Switch 101 is the upstream switch (i.e., the switch from which switches 104 and 105 have received query messages 142-2 and 142-3, respectively), of switches 104 and 105 in the multicast tree. Hence, report messages 144 and 146, with the multicast address as the destination address, reach switch 101 from switches 104 and 105, respectively. In some embodiments, switches 104 and 105 enable an "alert" option in report messages 144 and 146, respectively. This alert option allows switch 101 to process report messages 144 and 146 even though these messages are not specifically addressed to switch 101.

Upon receiving report messages 144 and 146, switch 101 processes the messages and identifies these messages as multicast topology report messages. Based on this identification, even though these messages are addressed to the multicast group, switch 101 does not forward the messages to downstream switches. For example, based on this identification, switch 101 does not forward report message 144 to switch 105 even though report message 144's destination address is the address of the multicast group. In some embodiments, switch 101 extracts the contents, such as the multicast information associated with switches 104 and 105, from report messages 144 and 146, respectively, and summarizes the extracted information. Switch 101 then creates a multicast topology report message 148, includes the summarized information in the report message, adds local multicast and additional information, and enables the alert option. Switch 101 sends report message 148 to the multicast address of the multicast group.

Switches 104 and 105 can send report messages 144 and 146 at different points of time. In some embodiments, after receiving a report message from one switch, switch 101 can wait for a certain period of time (can be referred to as a "waiting period") for the arrival of another switch. For example, after receiving report message 144 from switch 104, switch 101 can wait for a report message from switch 105. In this way, switch 101 can receive report messages from all downstream switches and summarize their contents. Allowing switch 101 to wait for report messages from all downstream switches can lead to efficient message exchange via the multicast tree. In some embodiments, switch 101 only summarizes the report messages received within the waiting period. Any report message received after this period can trigger another waiting period and is processed separately.

Root switch 110 receives report message 148 from switch 101, extracts information from report message 148, and constructs the multicast topology for the multicast group based on the extracted information. In this way, one single instruction can construct the multicast topology for the multicast group without requiring repetitive messaging. Because the query and report messages (e.g., messages 142, 144, 146, and 148) traverse the multicast distribution tree, the constructed multicast topology accurately represents the paths to all leaf switches in the multicast distribution tree. Furthermore, switch 110 can also receive additional information, such as multicast state validation information, and link capacity and utilization information. Hence, switch 110 can construct an accurate multicast topology with additional information using a single command.

Figure 1B:
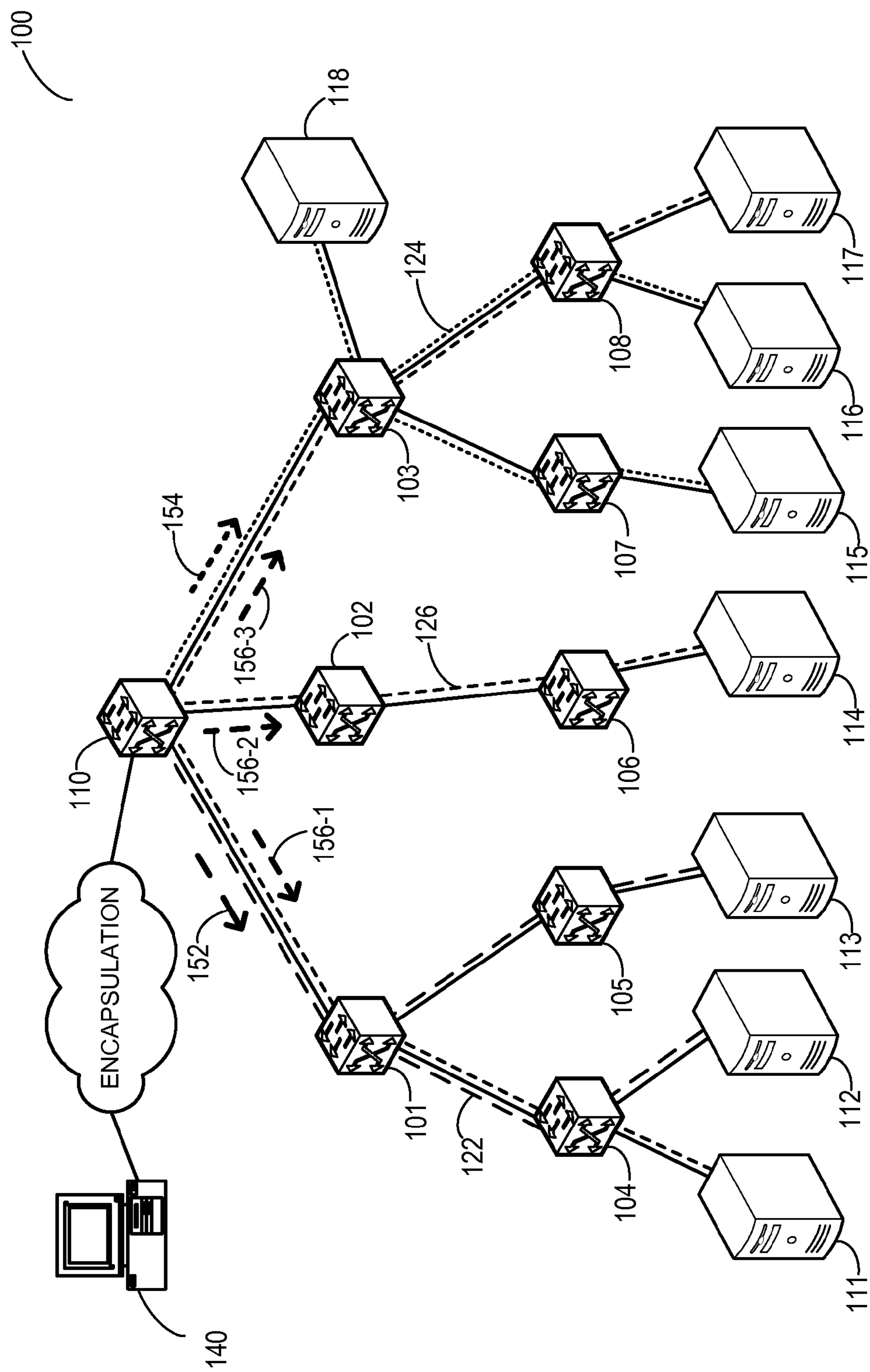
FIG. 1B illustrates exemplary layer-2 multicast topology construction for a plurality of multicast groups, in accordance with an embodiment of the present invention.

FIG. 1B illustrates an exemplary layer-2 multicast topology construction for a plurality of multicast groups, in accordance with an embodiment of the present invention. In this example, switch 110 operates as the root switch for multicast groups 122, 124, and 126. During operation, end devices 112 and 113 join multicast group 122; end devices 115, 116, and 118 join multicast group 124; and end devices 111, 114, and 117 join multicast group 126. The multicast distribution tree for multicast group 122 includes switches 101, 104, and 105. In some embodiments, end device 140 sends a notification message comprising an instruction to switch 110 to construct a layer-2 multicast topology for multicast group 122. To obtain multicast topology for multicast group 122, switch 110 sends a multicast topology query message 152 to switch 101, which further forwards query message 152 to switches 104 and 105. Leaf switches 104 and 105 then send report messages, hop-by-hop, to root switch 110, thereby allowing root switch 110 to construct the topology for multicast group 122, as described in conjunction with FIG. 1A.

Similarly, the multicast distribution tree for multicast group 124 includes switches 103, 107, and 108. To obtain multicast topology for multicast group 124, switch 110 sends a multicast topology query message 154 to switch 103. Switch 103 has a locally coupled end device 118, which has joined multicast group 124. However, because switch 103 is coupled to two downstream switches 107 and 108, switch 103 does not consider itself a leaf switch and forwards query message 154 to switches 107 and 108. Leaf switches 107 and 108 then send report messages, hop-by-hop, to root switch 110, thereby allowing root switch 110 to construct the topology for multicast group 124, as described in conjunction with FIG. 1A.

The multicast distribution tree for multicast group 126 includes switches 101, 102, 103, 104, 106, and 108. To obtain multicast topology for multicast group 126, switch 110 sends a multicast topology query message 156-1 to switch 101, query message 156-2 to switch 102, and query message 156-3 to switch 103. Query messages 156-1, 156-2, and 156-3 are copies of the same query message and can generally be referred to as query message 156. Switch 101 detects that downstream switch 104 is in the multicast distribution tree for multicast group 126 while downstream switch 105 is not. Hence, switch 101 forwards query message 156-1 to switch 104 and not to switch 105. Similarly, switch 102 forwards query message 156-2 to switch 106, and switch 103 forwards query message 156-3 to switch 108. Leaf switches 104, 106, and 108 then send report messages, hop-by-hop, to root switch 110, thereby allowing root switch 110 to construct the topology for multicast group 126, as described in conjunction with FIG. 1A.

In some embodiments, switch 110 can flood query message 152 to switches 101, 102, and 103 (i.e., to all downstream switches coupled via local ports). Upon receiving a query message, switches 101, 102, and 103 can also forward the message to all downstream switches. When query message 152 reaches a leaf switch, such as switch 106, which is not locally coupled to any end device associated with multicast group 122, switch 106 discards query message 152. In some embodiments, some switches in network 100 can flood a query message while some other switches can prune. In this example, even though switch 110 can flood query message 152, switch 103 can detect that no end device coupled to switch 103 or downstream switches 107 and 108 is associated with multicast group 122 and performs pruning by discarding query message 152.

Multicast Topology Query Message

Figure 2A:
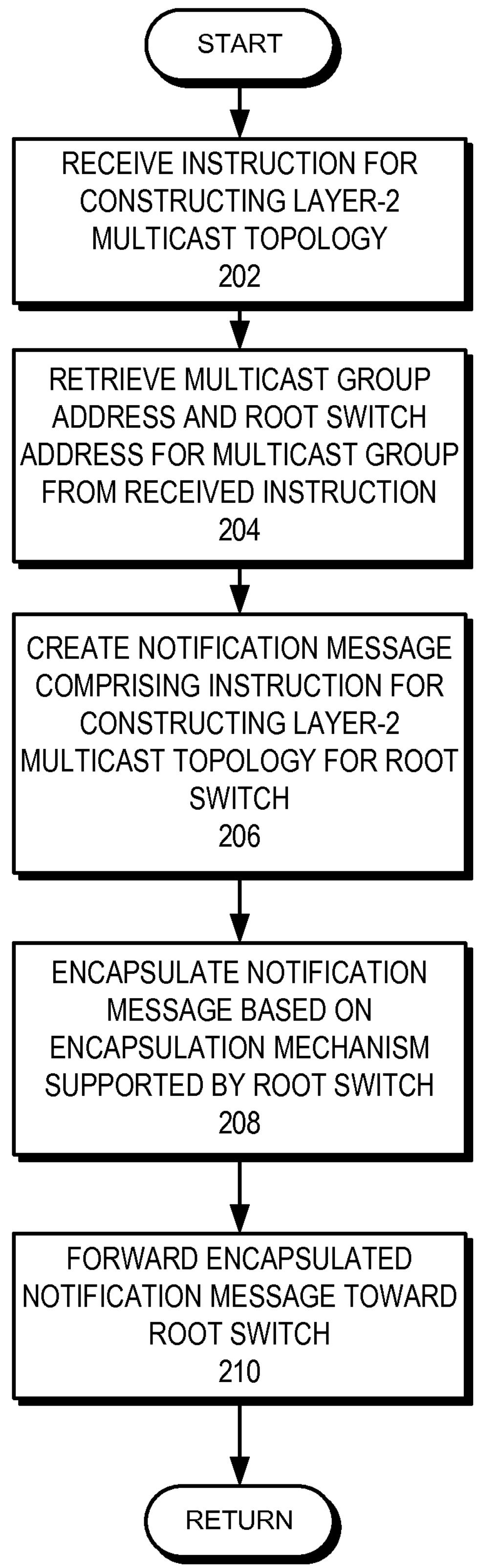
FIG. 2A presents a flowchart illustrating the process of an administrator device instructing a root switch to construct a layer-2 multicast topology, in accordance with an embodiment of the present invention.

In the example in FIG. 1B, root switch 110 can receive instructions from end device 140, which can be an administrator device, to construct multicast topologies for multicast groups 122, 124, and 126. In response, switch 110 sends query messages 152, 154, and 156 to obtain the corresponding multicast topologies. FIG. 2A presents a flowchart illustrating the process of an administrator device instructing a root switch to construct a layer-2 multicast topology, in accordance with an embodiment of the present invention. Upon receiving an instruction for constructing a layer-2 multicast topology (e.g., from a network administrator) for a multicast group (operation 202), the administrator device retrieves the multicast address and the root switch address for the multicast group from the received instruction (operation 204). In some embodiments, the administrator device receives the instruction from a network administrator via a command line interface, a network management tool, a web interface, or any other type of interaction mechanism associated with the administrator device.

The administrator device then creates a notification message for the root switch based on the received instruction (operation 206). In some embodiments, the administrator device encapsulates the notification message based on an encapsulation mechanism supported by the root switch (operation 208) and forwards the encapsulated notification message toward the root switch (operation 210). Such an encapsulation mechanism can correspond to a tunneling mechanism. Examples of a tunneling mechanism include, but are not limited to, Virtual Extensible Local Area Network (VXLAN) protocol, Generic Routing Encapsulation (GRE) protocol, Network Virtualization using GRE (NVGRE) protocol, and openvSwitch GRE protocol.

Figure 2B:
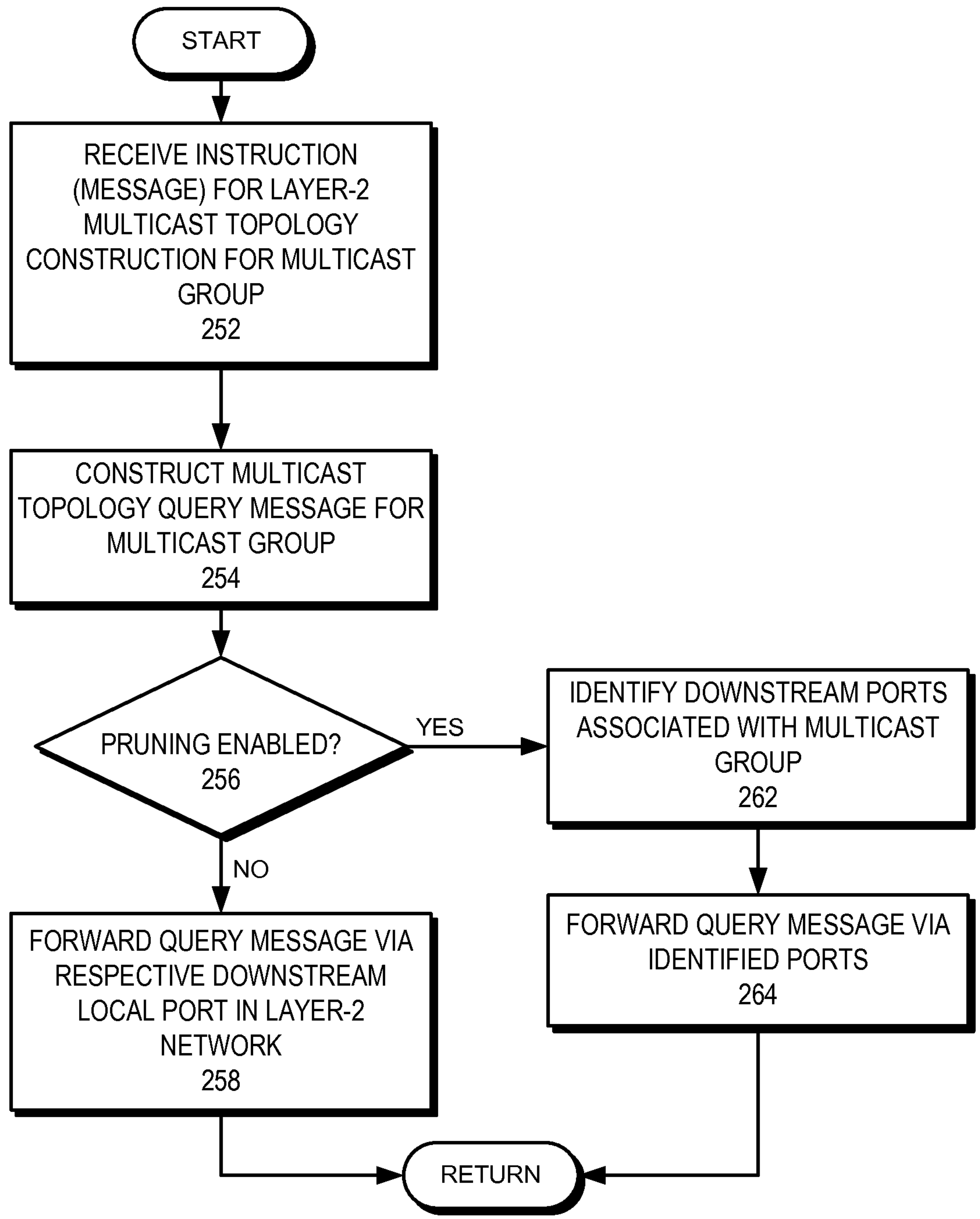
FIG. 2B presents a flowchart illustrating the process of a root switch processing an instruction for constructing a layer-2 multicast topology, in accordance with an embodiment of the present invention.

FIG. 2B presents a flowchart illustrating the process of a root switch processing an instruction for constructing a layer-2 multicast topology, in accordance with an embodiment of the present invention. During operation, the root switch can receive an instruction, from a network administrator or from an administrator device via a notification message, to construct the multicast topology for the multicast group (operation 252). The switch then constructs a multicast topology query message for the multicast group (operation 254) and checks whether pruning is enabled for the switch (operation 256). If so, the switch identifies the downstream ports associated with the multicast group in the layer-2 network (operation 262) and forwards the query message via the identified ports (operation 264). In some embodiments, the switch identifies the downstream ports associated with the multicast group by detecting the ports to which the downstream switches of the corresponding multicast tree are coupled. If pruning is not enabled, the switch forwards the multicast query via the respective downstream local port in the layer-2 network (operation 258). The switch, for example, does not forward the multicast query to the port from which it has received the instruction or to ports belonging to a different layer-2 network (e.g., a different VLAN).

Figure 3:
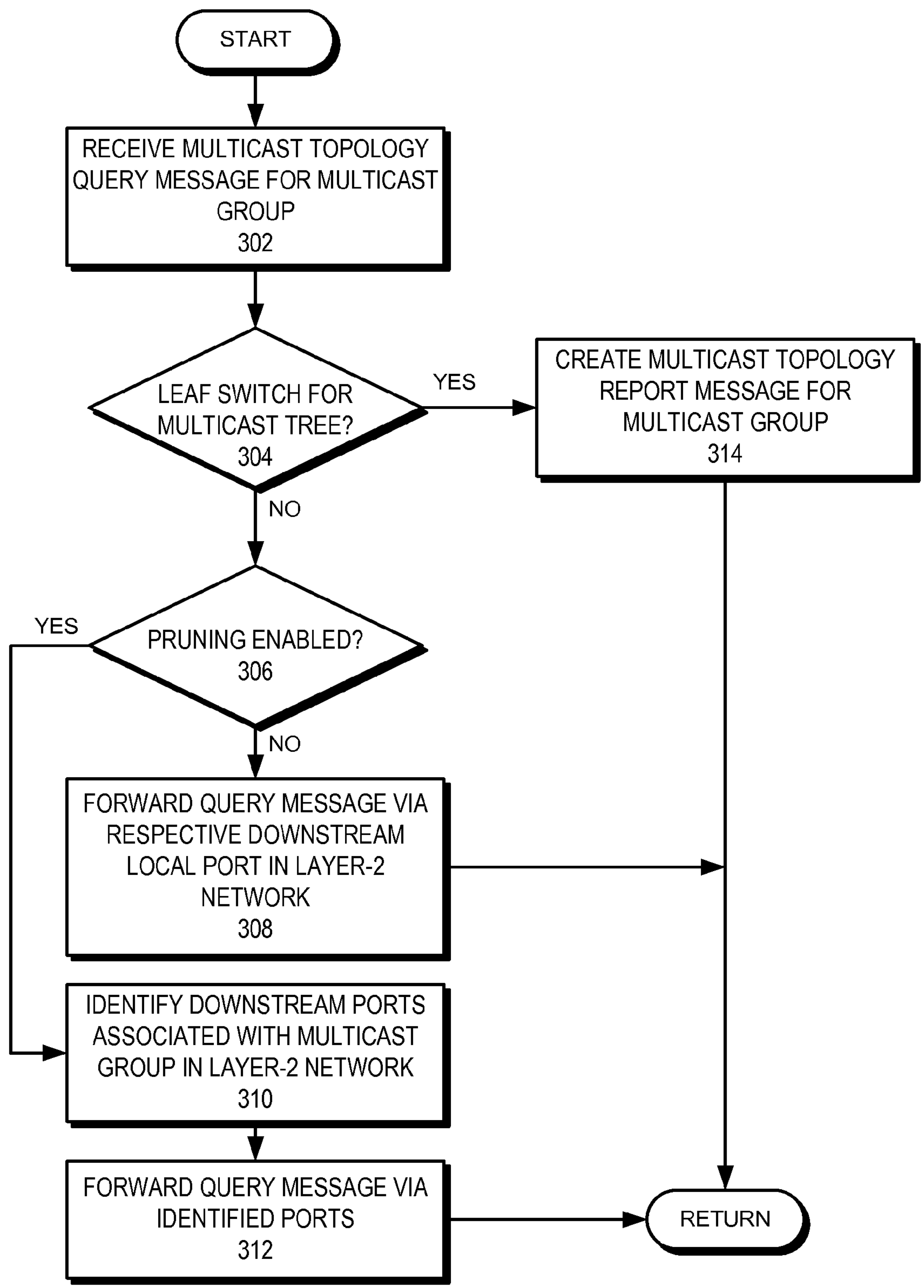
FIG. 3 presents a flowchart illustrating the process of a switch processing a multicast topology query message for constructing a layer-2 multicast topology, in accordance with an embodiment of the present invention.

FIG. 3 presents a flowchart illustrating the process of a switch processing a multicast topology query message for constructing a layer-2 multicast topology, in accordance with an embodiment of the present invention. During operation, the switch receives a multicast topology query message for a multicast group (operation 302). The switch receives this query message from an upstream switch. The switch then checks whether the switch is a leaf switch of the multicast distribution tree of the multicast group (operation 304). If so, the switch creates a multicast topology report message for the multicast group (operation 314), as described in conjunction with FIG. 1A.

If the switch is not a leaf node, the switch checks whether pruning is enabled for the switch (operation 306). If pruning is not enabled, the switch forwards the multicast query via a respective downstream local port in the layer-2 network (e.g., ports belonging to a VLAN) (operation 308). If pruning is enabled, the switch identifies the downstream ports associated with the multicast group in the layer-2 network (operation 310) and forwards the query message via the identified ports (operation 312). In some embodiments, the switch identifies the downstream ports associated with the multicast group by detecting the ports to which the downstream switches of the corresponding multicast tree are coupled.

Multicast Topology Report Message

Figure 4:
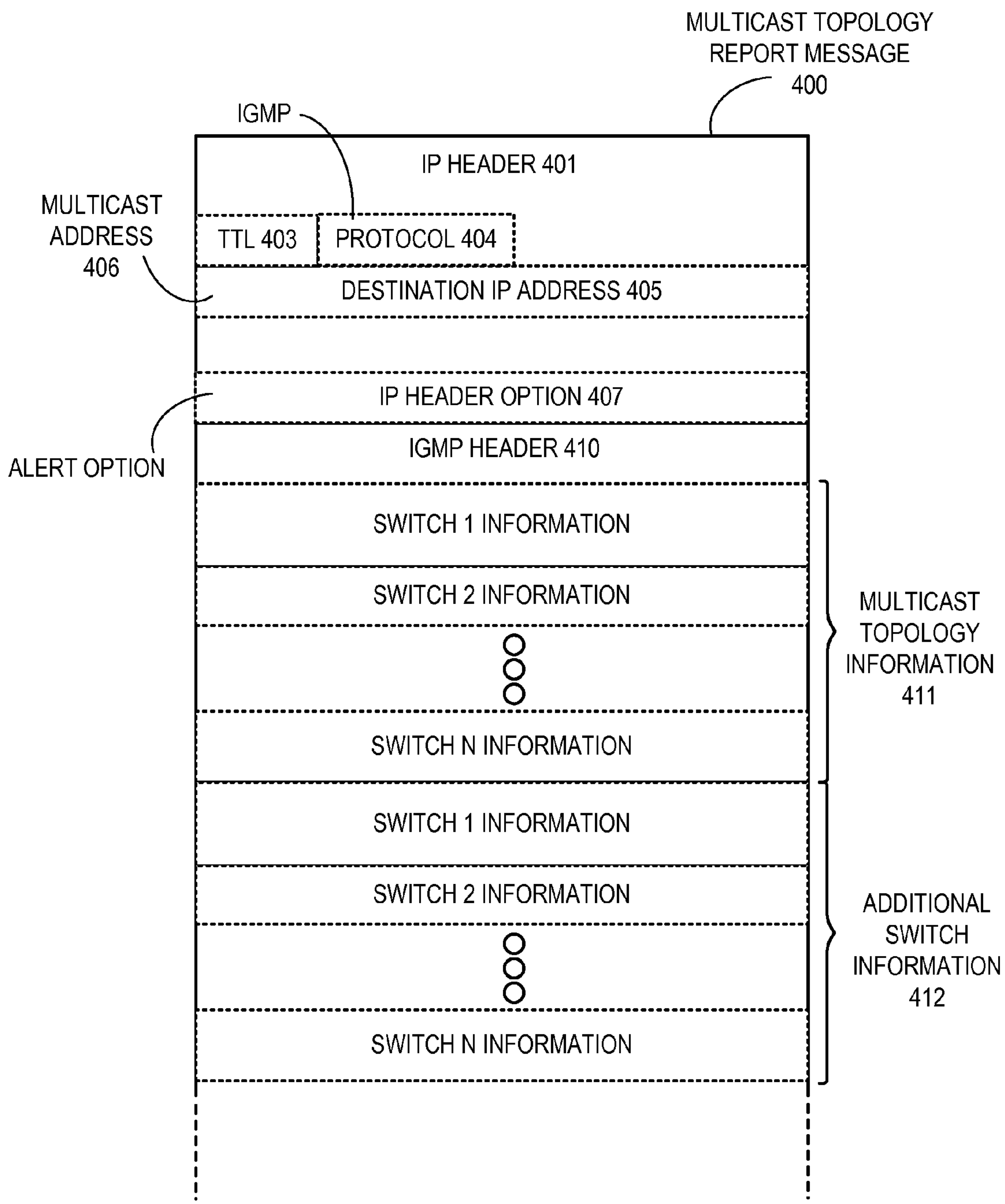
FIG. 4 illustrates an exemplary multicast topology report message, in accordance with an embodiment of the present invention.

In the example in FIG. 1A, root switch 110 sends multicast topology query message 142-1 and, in response, receives multicast topology report message 148 to obtain the multicast topology for the corresponding multicast group. FIG. 4 illustrates an exemplary multicast topology report message, in accordance with an embodiment of the present invention. In this example, multicast topology report message 400 comprises multicast topology information 411 from N downstream switches associated with a multicast group. Report message 400 can also include additional switch information 412 for the N downstream switches.

Examples of multicast topology information 411 for a respective switch include, but are not limited to, one or more identifiers of the switch in the multicast group (e.g., a layer-2 media access control (MAC) address and/or a layer-3 IP address), an indicator of membership in a multicast group, a port identifier which identifies the upstream port coupled to the parent switch of the switch, a list of downstream ports associated with the multicast group, and information regarding any layer-3 router coupled to the switch. Examples of additional switch information 412 for a respective switch include, but are not limited to, multicast validation information, link capacity and/or utilization of the links between switches, VLAN information, and encapsulation (e.g., tunneling) information.

In some embodiments, report message 400 is an IGMP report message comprising an IP header 401 and an IGMP header 410. IP header 401 includes one or more fields which identify message 400 as an IGMP message. These fields include time to leave (TTL) 403, protocol 404, and destination IP address 405. Protocol 404 indicates IGMP protocol and TTL 403 is set to 1, which is typical for an IGMP message. Multicast address 406 of the multicast group is assigned to destination IP address 405. Based on the multicast group address 406, report message 400 can travel to the switches associated with the multicast group. In some embodiments, IP header 401 includes an IP header option 407, which is set to a value indicating that the alert option is enabled for report message 400. For example, a value of 20 in IP header option 407 can indicate that the alert option is enabled.

Figure 5A:
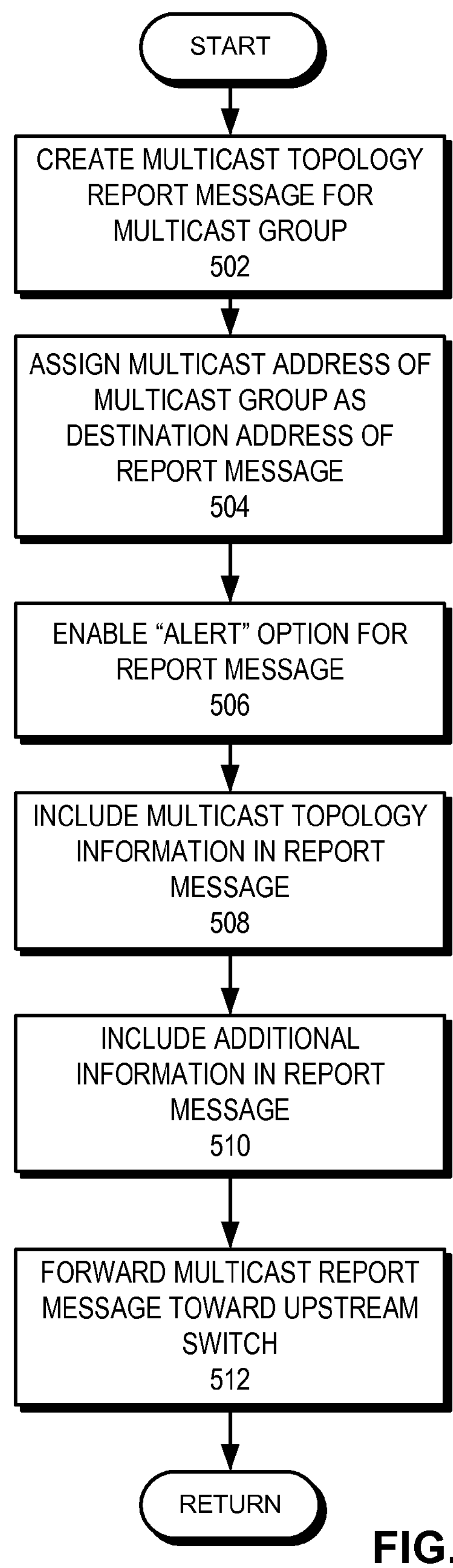
FIG. 5A presents a flowchart illustrating the process of a leaf switch issuing a multicast topology report message for constructing a layer-2 multicast topology, in accordance with an embodiment of the present invention.

FIG. 5A presents a flowchart illustrating the process of a leaf switch issuing a multicast topology report message for constructing a layer-2 multicast topology, in accordance with an embodiment of the present invention. During operation, the switch receives a multicast topology query message for a multicast group and detects itself as a leaf switch, as described in conjunction with FIG. 3. The switch creates a multicast topology report message for the multicast group (operation 502) and assigns the multicast address of the multicast group as the destination address of the report message (operation 504), as described in conjunction with FIG. 4. The switch enables the alert option for the report message (operation 506) and includes the multicast topology information in the report message (operation 508). In some embodiments, the switch can also include additional information in the report message (operation 510). The switch then forwards the report message toward the upstream switch (operation 512).

Figure 5B:
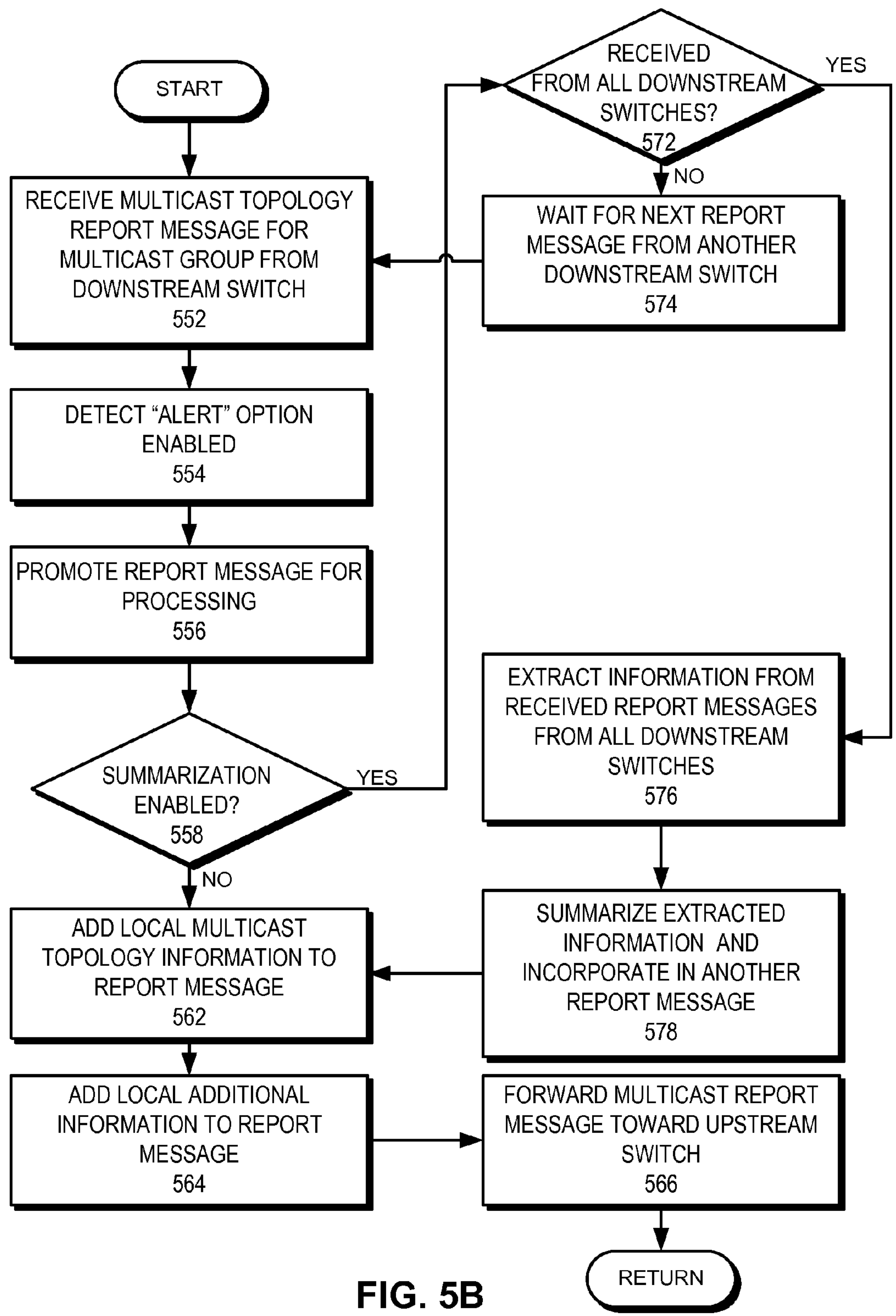
FIG. 5B presents a flowchart illustrating the process of a switch processing a multicast topology report message for constructing a layer-2 multicast topology, in accordance with an embodiment of the present invention.

FIG. 5B presents a flowchart illustrating the process of a switch processing a multicast topology report message for constructing a layer-2 multicast topology, in accordance with an embodiment of the present invention. Upon receiving a multicast topology report message from a downstream switch (operation 552), the switch detects that the "alert" option is enabled (operation 554) and promotes the message for processing (operation 556). Hence, instead of forwarding the message via switch hardware, the switch extracts the contents and processes the message accordingly. The switch then checks whether summarization is enabled for the switch (operation 558). If not, the switch adds local multicast topology information to the report message (operation 562) and local additional information to the report message (operation 564), and forwards the message toward the upstream switch or router (operation 566).

If summarization is enabled for the switch (operation 558), the switch checks whether the switch has received report messages from all downstream switches (operation 572). If not, the switch waits for the next report message from another downstream switch (operation 574) and continues to receive the report messages (operation 552). If the switch has received report messages from all downstream switches, the switch extracts information from the received report messages from all downstream switches (operation 576) and summarizes the extracted information and incorporates the summarized information in another report message (operation 578). The switch then adds local multicast topology information to the report message (operation 562) and additional information to the report message (operation 564), and forwards the message toward the upstream switch (operation 566).

Encapsulation

Figure 6:
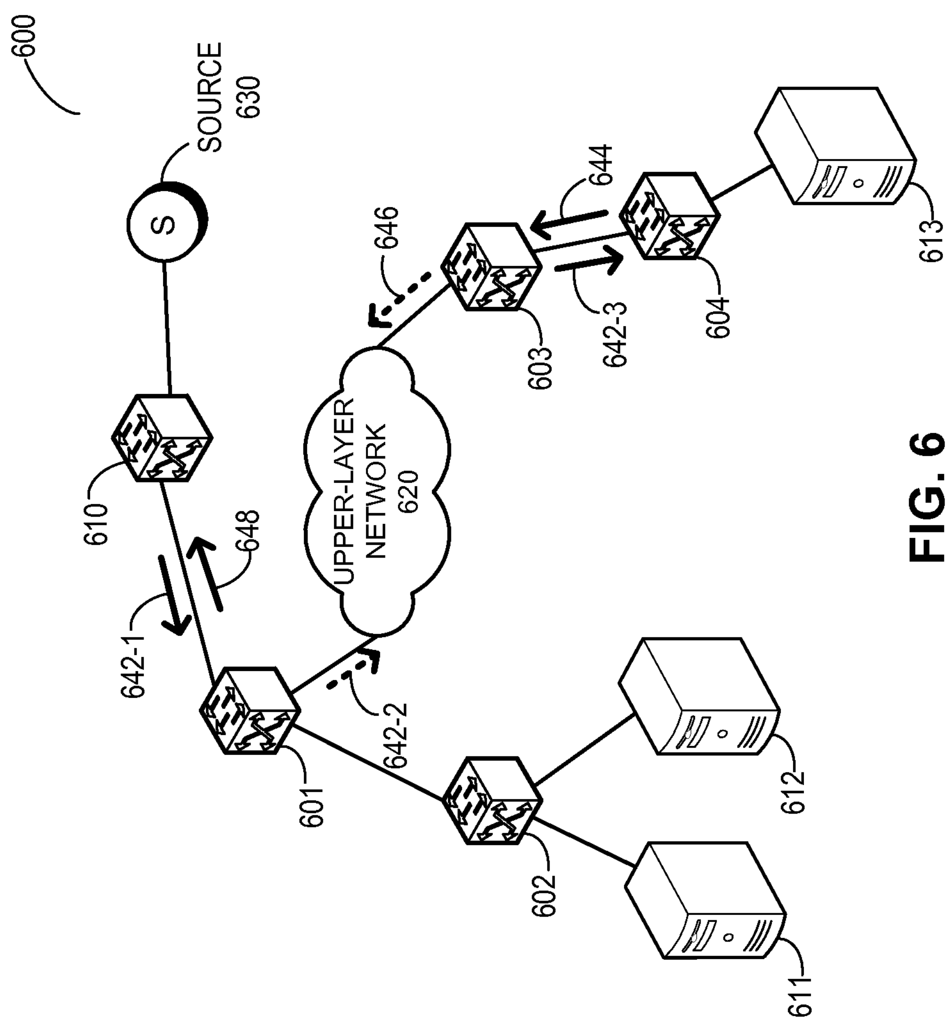
FIG. 6 illustrates an exemplary layer-2 multicast topology construction in a virtualized layer-2 network spanning an upper-layer network, in accordance with an embodiment of the present invention.

FIG. 6 illustrates an exemplary layer-2 multicast topology construction in a virtualized layer-2 network spanning an upper-layer network, in accordance with an embodiment of the present invention. A virtualized layer-2 network 600 includes switches 601, 602, 603, and 604. In some embodiments, network 600 is a VLAN. In some embodiments, one or more switches in network 600 can be in a fabric switch and can appear as a single logical switch to all other switches in network 600. End devices 611 and 612 are coupled to switch 602, and end device 613 is coupled to switch 604. Switch 610 is coupled to switch 601. A source 630, which can be an end device, for a multicast group is coupled to switch 610.

During operation, switch 610 distributes periodic membership queries to the multicast group through network 600. In some embodiments, switch 610 is a layer-3 router and generates the membership queries. One or more of the end devices 611-613 can join the multicast group by sending a join request in response to the membership query. In this way, the end devices become receivers of multicast data traffic from source 630. By forwarding multicast membership queries and join messages, a respective switch in network 600 is aware of the membership in the multicast group and forms an association with the multicast group. In some embodiments, IGMP and/or MLD can be used for the membership queries and corresponding join requests. Switch 610 directs data traffic from source 630 toward the receivers via the switches in network 600, thereby forming a multicast distribution tree rooted at switch 610 for the multicast group. Switch 610 operates as the root switch for the multicast distribution tree because switch 610 is coupled to source 630 and first receives multicast data traffic from source 630 in network 600. In the multicast distribution tree, switches 602 and 604 are the leaf switches.

Suppose that end device 613 has joined the multicast group and has become a receiver of data traffic from source 630. Hence, the corresponding multicast topology represents a forwarding data path from switch 610 to switch 604, which is coupled to end device 613. This forwarding path includes intermediate switches 601 and 603. In this example, even though switches 601 and 603 are in the same virtualized layer-2 network 600, switches 601 are 603 are coupled to each other via an upper-layer network 620. Upper-layer network 620 can refer to any network which includes networking layers higher than layer-2. Examples of an upper-network include, but are not limited to, a layer-3 (e.g., IP) network, a TRILL network, or a combination of networking layers.

Upon receiving an instruction for constructing a layer-2 multicast topology, root switch 610 sends a multicast topology query message 642-1 to switch 601. For further forwarding of query message 642-1, switch 601 identifies switch 603 as the downstream switch in the multicast distribution tree. However, because switches 601 and 603 are separated by network 620, switch 601 forwards query message 642-1 toward switch 603 in such a way that query message 642-1 can be forwarded via network 620 to reach switch 603. In some embodiments, switch 601 encapsulates query message 642-1 based on a tunnel encapsulation and forwards encapsulated query message 642-2 (denoted with dotted line) toward switch 603. Query message 642-2 is forwarded via network 620 based on the encapsulation and reaches switch 603. Upon receiving query message 642-2, switch 603 decapsulates the tunnel encapsulation and sends the decapsulated multicast topology query message 642-3 to switch 604. Note that query messages 642-1, 642-2, and 642-3 are copies of the same query message and can generally be referred to as query message 642.

Upon receiving query message 642-3, switch 604 identifies itself as a leaf switch and constructs a multicast topology report message 644, and includes multicast topology information and additional information in report message 644. Switch 604 sends report message 644 to the multicast address of the multicast group. Because switch 603 is the upstream switch of the multicast tree, switch 603 receives the message. In some embodiments, switch 604 enables an "alert" option in report message 644. This alert option allows switch 603 to process report message 644 even though report message 644 is not specifically addressed to switch 603. Upon receiving report message 644, switch 603 processes report message 644 and identifies report message 644 as a multicast topology report message. Switch 603 then constructs a report message 646, includes the information from report message 644 in report message 646, adds local multicast topology and additional information to report message 646, and enables the alert option.

In some embodiments, switch 603 includes information regarding upper-layer network 620 and tunneling information in report message 646. Switch 603 then encapsulates report message 646 based on a tunnel encapsulation and forwards encapsulated report message 646 (denoted with dotted line) toward switch 601. Report message 646 is forwarded via network 620 based on the encapsulation and reaches switch 601. Upon receiving report message 646, switch 601 decapsulates the tunnel encapsulation, processes report message 646, and identifies report message 646 as a multicast topology report message. Switch 601 then constructs a report message 648, includes the information from report message 646 in report message 648, and adds local multicast topology and additional information to report message 648. Switch 601 enables the alert option for report message 648 and sends report message 648 to the multicast address of the multicast group. Root switch 610 receives report message 648, extracts information from report message 648, and constructs the multicast topology for the multicast group based on the extracted information. Because the query and report messages (e.g., messages 642, 644, 646, and 648) traverse the multicast distribution tree, the constructed multicast topology accurately represents paths to all leaf switches in the multicast distribution tree. In this way, one single instruction can construct the multicast topology for the multicast group without requiring repetitive messaging even when the switches associated with the multicast group are coupled via an upper-layer network.

Figure 7:
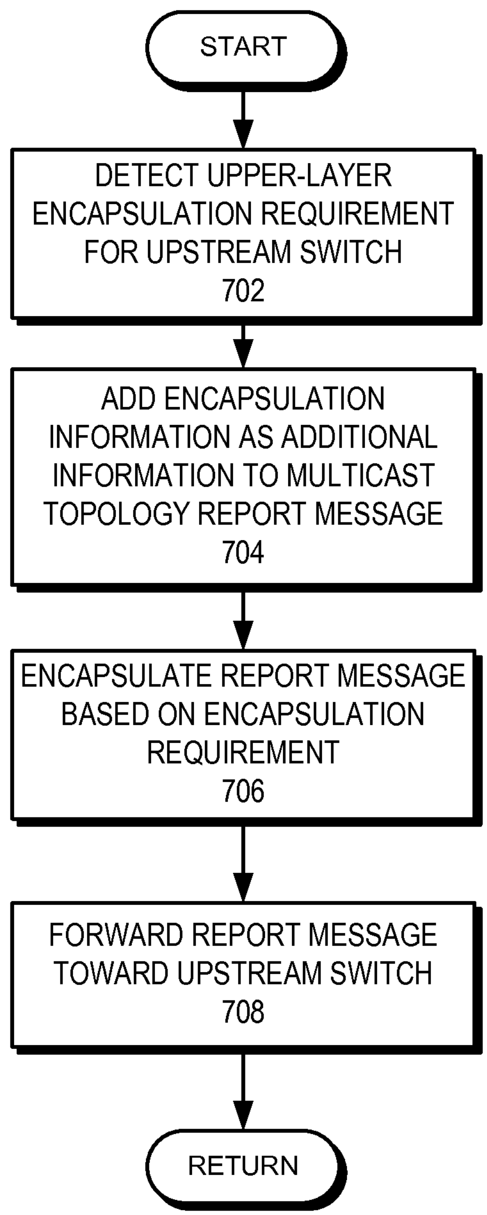
FIG. 7 presents a flowchart illustrating the process of a switch in a virtualized layer-2 network forwarding a multicast topology report message across an upper-layer network, in accordance with an embodiment of the present invention.

FIG. 7 presents a flowchart illustrating the process of a switch in a virtualized layer-2 network forwarding a multicast topology report message across an upper-layer network, in accordance with an embodiment of the present invention. During the forwarding process of the report message, as described in conjunction with FIGS. 5A and 5B, the switch detects an upper-layer encapsulation requirement for an upstream switch of the switch (operation 702), as described in conjunction with FIG. 6. The switch then adds encapsulation information as additional information to the report message (operation 704). The switch encapsulates the report message based on the detected encapsulation requirement (operation 706) and forwards the report message toward the upstream switch based on the encapsulation requirement (operation 708).

Exemplary Switch

Figure 8:
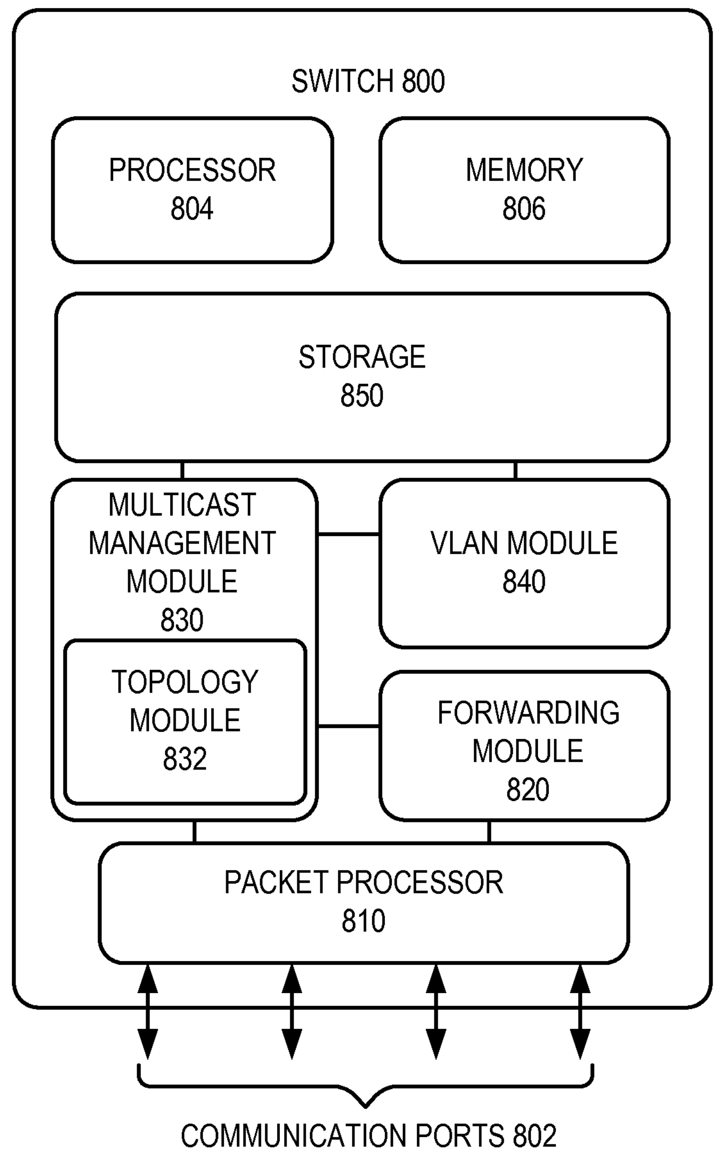
FIG. 8 illustrates an exemplary switch supporting efficient multicast topology construction, in accordance with an embodiment of the present invention.

FIG. 8 illustrates an exemplary switch supporting efficient multicast topology construction, in accordance with an embodiment of the present invention. In this example, a switch 800 includes a general purpose processor 804, a memory 806, a number of communication ports 802, a packet processor 810, a multicast management module 830, a topology module 832, a VLAN module 840, a forwarding module 820, and a storage 850. Processor 804 executes instructions stored in memory 806 to facilitate layer-2 multicast topology construction for a multicast group by switch 800. VLAN module 840 maintains a membership in a virtualized layer-2 network (e.g., a VLAN) for switch 800.

During operation, switch 800 receives a multicast query message via one of the communication ports 802. In response, multicast management module 830 determines whether switch 800 is a leaf switch of a multicast distribution tree of a multicast group. If switch 800 is a leaf switch, topology module 832 constructs a multicast topology report message comprising layer-2 topology information of the multicast group associated with switch 800. Topology module 832 can also include additional information in the multicast topology report message. Forwarding module 820 forwards the report message based on a multicast address of the multicast group. In some embodiments, topology module 832 can enable an alert option for the report message.

If multicast management module 830 determines that switch 800 is not a leaf switch, packet processor 810 extracts layer-2 topology information of the multicast group from a multicast topology report message received via one of the communication ports 802. Topology module 832 adds topology information of the multicast group associated with switch 800 in the report message. Forwarding module 820 then forwards the report message to the upstream switch. Multicast management module 830 precludes forwarding module 820 from forwarding the report message to downstream switches of the multicast distribution tree.

In some embodiments, packet processor 810 extracts layer-2 topology information of the multicast group from a plurality of multicast topology report messages, which correspond to a plurality of downstream switches and are received via a plurality of the communication ports 802. Topology module 832 constructs a new report message, summarizes the extracted layer-2 topology information, and includes the summarized information in the report message. Topology module 832 then includes topology and additional information associated with switch 800 in the new report message. Forwarding module 820 forwards the new report message to the upstream switch.

Note that the above-mentioned modules can be implemented in hardware as well as in software. In one embodiment, these modules can be embodied in computer-executable instructions stored in a memory which is coupled to one or more processors in switch 800. When executed, these instructions cause the processor(s) to perform the aforementioned functions.

In summary, embodiments of the present invention provide a switch and a method for constructing a multicast topology in a layer-2 network. In one embodiment, the switch includes a processor and a computer-readable storage medium. The computer-readable storage medium stores instructions which when executed by the processor cause the processor to perform a method. The method comprises determining whether the switch is a leaf switch of a multicast distribution tree of a multicast group based on a multicast topology query message from a root switch of the multicast distribution tree. If the switch is a leaf switch, the method further comprises constructing a multicast topology report message comprising layer-2 topology information of the multicast group associated with the switch.

The methods and processes described herein can be embodied as code and/or data, which can be stored in a computer-readable non-transitory storage medium. When a computer system reads and executes the code and/or data stored on the computer-readable non-transitory storage medium, the computer system performs the methods and processes embodied as data structures and code and stored within the medium.

The methods and processes described herein can be executed by and/or included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A switch, comprising:

a processor; and a computer-readable storage medium storing instructions which when executed by the processor cause the processor to perform a method, the method comprising:

determining whether the switch is a leaf switch of a multicast distribution tree of a multicast group based on a multicast topology query message from a root switch of the multicast distribution tree; and in response to determining the switch to be the leaf switch, constructing a first multicast topology report message comprising layer-2 topology information of the multicast group associated with the switch; and in response to determining the switch not to be the leaf switch, extracting layer-2 topology information of the multicast group from a second multicast topology report message.

2. The switch of claim 1, wherein the method further comprises, in response to determining the switch to be the leaf switch, including additional information in the first multicast topology report message, wherein the additional information includes device and link information associated with the switch.

3. The switch of claim 1, wherein the destination address of the first multicast topology report message corresponds to a multicast address of the multicast group.

4. The switch of claim 1, wherein the method further comprises enabling an alert option for the first multicast topology report message, wherein the alert option allows a second switch to process contents of the first multicast topology report message.

5. The switch of claim 1, wherein the method further comprises, in response to determining the switch not to be the leaf switch, including layer-2 topology information of the multicast group associated with the switch in the second multicast topology report message.

6. The switch of claim 1, wherein the method further comprises, in response to determining the switch not to be the leaf switch, extracting layer-2 topology information of the multicast group from a third multicast topology report message; and wherein the layer-2 topology information extracted from the second and third multicast topology report messages is associated with a plurality of downstream switches in the multicast distribution tree with respect to the switch.

7. The switch of claim 6, wherein the method further comprises:

summarizing the extracted layer-2 topology information associated with the plurality of downstream switches;

including the summarized information in a fourth multicast topology report message; and including layer-2 topology information of the multicast group associated with the switch in the fourth multicast topology report message.

8. The switch of claim 7, wherein the method further comprises precluding the switch from associating a local port with the fourth multicast topology report message as an output port, wherein the local port is coupled to a downstream switch of the multicast distribution tree.

9. A method, comprising:

determining whether a switch is a leaf switch of a multicast distribution tree of a multicast group based on a multicast topology query message from a root switch of the multicast distribution tree;

in response to determining the switch to be the leaf switch, constructing a first multicast topology report message comprising layer-2 topology information of the multicast group associated with the switch; and in response to determining the switch not to be the leaf switch, extracting layer-2 topology information of the multicast group from a second multicast topology report message.

10. The method of claim 9, further comprising, in response to determining the switch to be the leaf switch, including additional information in the first multicast topology report message, wherein the additional information includes device and link information associated with the switch.

11. The method of claim 9, wherein the destination address of the first multicast topology report message corresponds to a multicast address of the multicast group.

12. The method of claim 9, further comprising enabling an alert option for the first multicast topology report message, wherein the alert option allows a second switch to process contents of the first multicast topology report message.

13. The method of claim 9, further comprising, in response to determining the switch not to be the leaf switch, including layer-2 topology information of the multicast group associated with the switch in the second multicast topology report message.

14. The method of claim 9, further comprising, in response to determining the switch not to be the leaf switch, extracting layer-2 topology information of the multicast group from a third multicast topology report message; and wherein the layer-2 topology information extracted from the second and third multicast topology report messages is associated with a plurality of downstream switches in the multicast distribution tree with respect to the switch.

15. The method of claim 14, further comprising:

summarizing the extracted layer-2 topology information associated with the plurality of downstream switches;

including the summarized information in a fourth multicast topology report message; and including layer-2 topology information of the multicast group associated with the switch in the fourth multicast topology report message.

16. The method of claim 15, further comprising precluding the switch from associating a local port with the fourth multicast topology report message as an output port, wherein the local port is coupled to a downstream switch of the multicast distribution tree.

17. A non-transitory computer-readable medium storing instructions which when executed by a computer cause the computer to perform a method for facilitating traffic isolation in a network, the method comprising:

determining whether a switch is a leaf switch of a multicast distribution tree of a multicast group based on a multicast topology query message from a root switch of the multicast distribution tree;

in response to determining the switch to be the leaf switch, constructing a first multicast topology report message comprising layer-2 topology information of the multicast group associated with the switch; and in response to determining the switch not to be the leaf switch, extracting layer-2 topology information of the multicast group from a second multicast topology report message.

18. The non-transitory computer-readable medium of claim 17, wherein the method further comprises in response to determining the switch not to be the leaf switch:

including layer-2 topology information of the multicast group associated with the switch in the second multicast topology report message.

19. The non-transitory computer-readable medium of claim 17, further comprising:

summarizing layer-2 topology information corresponding extracted from a plurality of multicast topology report messages received from a plurality of downstream switches;

including the summarized information in a third multicast topology report message; and including layer-2 topology information of the multicast group associated with the switch in the third multicast topology report message.

* * * * *